(12) United States Patent
Matsuzawa

(10) Patent No.: US 9,541,460 B2
(45) Date of Patent: Jan. 10, 2017

(54) PHYSICAL QUANTITY SENSOR, PRESSURE SENSOR, ALTIMETER, ELECTRONIC APPARATUS, AND MOVING OBJECT

(71) Applicant: Seiko Epson Corporation, Tokyo (JP)

(72) Inventor: Yusuke Matsuzawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/932,204

(22) Filed: Nov. 4, 2015

(65) Prior Publication Data

US 2016/0054188 A1     Feb. 25, 2016

Related U.S. Application Data

(63) Continuation of application No. 14/573,537, filed on Dec. 17, 2014, now Pat. No. 9,207,137.

(30) Foreign Application Priority Data

Dec. 18, 2013   (JP) ................. 2013-261887

(51) Int. Cl.
| | |
|---|---|
| *G01L 9/00* | (2006.01) |
| *G01L 7/08* | (2006.01) |
| *H01L 27/07* | (2006.01) |
| *H01L 41/04* | (2006.01) |
| *G01C 5/06* | (2006.01) |
| *G01C 21/28* | (2006.01) |
| *G01L 9/08* | (2006.01) |
| *G01C 5/00* | (2006.01) |

(52) U.S. Cl.
CPC ................. *G01L 7/082* (2013.01); *G01C 5/00* (2013.01); *G01C 5/06* (2013.01); *G01C 21/28* (2013.01); *G01L 9/0054* (2013.01); *G01L 9/085* (2013.01); *H01L 27/07* (2013.01); *H01L 41/042* (2013.01)

(58) Field of Classification Search
CPC ...... G01L 7/082; G01L 9/0052; G01L 9/0054; G01L 9/085; G01C 5/00; G01C 5/06; G01C 21/28; H01L 27/07; H01L 41/042; H01L 41/0475
USPC ........................................................ 257/419
See application file for complete search history.

(56) References Cited

U.S. PATENT DOCUMENTS

| | | |
|---|---|---|
| 5,719,069 A | 2/1998 | Sparks |
| 6,472,244 B1 | 10/2002 | Ferrari et al. |
| 8,558,330 B2 | 10/2013 | Yu et al. |

(Continued)

FOREIGN PATENT DOCUMENTS

| | | |
|---|---|---|
| JP | 05-102494 | 4/1993 |
| JP | 05-251714 | 9/1993 |

(Continued)

*Primary Examiner* — Tu-Tu Ho
(74) *Attorney, Agent, or Firm* — Harness, Dickey & Pierce, P.L.C.

(57) ABSTRACT

A physical quantity sensor includes a semiconductor substrate, a diaphragm section that is disposed on the semiconductor substrate and is flexurally deformed when receiving pressure, a sensor element that is disposed on the diaphragm section, an element-periphery structure member that is disposed on one surface side of the semiconductor substrate and forms a cavity section together with the diaphragm section, and a semiconductor circuit that is provided on the same surface side as the element-periphery structure member of the semiconductor substrate.

12 Claims, 10 Drawing Sheets

(56) References Cited

U.S. PATENT DOCUMENTS

| | | | | |
|---|---|---|---|---|
| 2009/0212378 A1* | 8/2009 | Schrank | ............... | B81C 1/0015 257/419 |
| 2010/0304518 A1* | 12/2010 | Suminto | ............ | B81C 1/00158 438/51 |
| 2014/0157893 A1* | 6/2014 | Matsuzawa | .............. | G01C 5/06 73/384 |
| 2015/0060956 A1* | 3/2015 | Chen | ................... | B81C 1/00246 257/254 |

FOREIGN PATENT DOCUMENTS

| | | |
|---|---|---|
| JP | 05-304304 | 11/1993 |
| JP | 06-291335 | 10/1994 |
| JP | 08-159899 | 6/1996 |
| JP | 08-097439 | 12/1996 |
| JP | 11-142270 | 5/1999 |
| JP | 2001-332746 A | 11/2001 |
| JP | 2004-053329 A | 2/2004 |
| JP | 2007093213 A | 4/2007 |

\* cited by examiner

PHYSICAL QUANTITY SENSOR, PRESSURE SENSOR, ALTIMETER, ELECTRONIC APPARATUS, AND MOVING OBJECT

CROSS-REFERENCE TO RELATED APPLICATIONS

This is a continuation patent application of U.S. application Ser. No. 14/573,537 filed Dec. 17, 2014, which claims priority to Japanese Patent Application No. 2013-261887, filed Dec. 18, 2013 is expressly incorporated by reference herein in their entireties.

BACKGROUND

1. Technical Field

The present invention relates to a physical quantity sensor, a pressure sensor, an altimeter, an electronic apparatus, and a moving object.

2. Related Art

A pressure sensor that includes a diaphragm which is flexurally deformed when receiving pressure is widely used. In such a pressure sensor, a sensor element such as a piezoresistive element or a vibration element is disposed on the diaphragm, then the sensor element detects the flexure of the diaphragm, and thus it is possible to detect pressure applied to the diaphragm.

For example, in a pressure sensor disclosed in JP-A-8-97439, a piezoresistive element and an integrated circuit (IC) that includes a circuit for drive, detection, or the like of the piezoresistive element are provided on one surface of a silicon substrate on which a diaphragm is formed, and a cavity is provided on the other surface of the silicon substrate. The cavity is sealed, and thereby it is possible to realize an absolute-pressure sensor.

However, in the pressure sensor disclosed in JP-A-8-97439, since the cavity is provided on a side opposite to the integrated circuit of the silicon substrate, a problem arises in that the size of the silicon substrate becomes great in the thickness direction. In addition, in the pressure sensor disclosed in JP-A-8-97439, in a case where the sealed cavity is formed, a process has to be included, in which another substrate is bonded to the silicon substrate. Therefore, a problem arises in that cost has to be increased.

SUMMARY

An advantage of some aspects of the invention is to provide a physical quantity sensor, in which it is possible to achieve a low profile and to lower cost, and in addition, to provide a pressure sensor, an altimeter, an electronic apparatus, and a moving object which include the physical quantity sensor.

Application Example 1

This application example is directed to a physical quantity sensor including: a semiconductor substrate; a diaphragm section that is disposed on the semiconductor substrate and is flexurally deformed when receiving pressure; a sensor element that is disposed on the diaphragm section; a wall section that is disposed on one surface side of the semiconductor substrate and configures a cavity together with the diaphragm section; and a circuit section that is provided on the same surface side as the wall section of the semiconductor substrate.

With this configuration, since the cavity (or wall section) and the circuit section are provided on the same surface side of the semiconductor substrate, a structure member that forms the cavity does not stick out from the side opposite to the circuit section of the semiconductor substrate. Therefore, it is possible to achieve a low profile. In addition, a CMOS process (particularly a process of forming an inter-layer insulation film or a wiring layer) is used, and it is possible to collectively form the wall section with the circuit section. Therefore, a manufacturing process of the physical quantity sensor is simplified, and as a result, it is possible to lower the cost of the physical quantity sensor. In addition, even in a case where the cavity is sealed, it is possible to seal the cavity using a film formation method, and thus there is no need to bond substrates so as to seal the cavity as in the related art. In this way, the manufacturing process of the physical quantity sensor is also simplified, and as a result, it is possible to lower the cost of the physical quantity sensor.

Application Example 2

In the physical quantity sensor according to the application example of the invention, it is preferable that the sensor element has a piezoresistive element.

With this configuration, in a case where the piezoresistive element and the circuit section are disposed on the same surface side of the semiconductor substrate, the CMOS process (particularly a process of forming a transistor) is used, and it is possible to collectively form the piezoresistive element with the circuit section. Therefore, it is possible to further simplify the manufacturing process of the physical quantity sensor.

Application Example 3

In the physical quantity sensor according to the application example of the invention, it is preferable that the sensor element is disposed on the same surface side as the wall section of the diaphragm section.

With this configuration, a CMOS process (particularly a process of forming a transistor) is used, and it is possible to collectively form the sensor element with the circuit section. Therefore, it is possible to further simplify the manufacturing process of the physical quantity sensor. In addition, it is possible to accommodate the sensor element inside the cavity, and therefore, it is possible to prevent the sensor element from degrading or to decrease characteristic degradation of the sensor element.

Application Example 4

In the physical quantity sensor according to the application example of the invention, it is preferable that the circuit section has an insulation layer that is disposed on the semiconductor substrate and a wiring section that penetrates through the insulation layer, and that the wall section is formed through the same film formation as at least one of the insulation layer and the wiring section.

With this configuration, the CMOS process (particularly a process of forming an inter-layer insulation film or a wiring layer) is used, and it is possible to collectively form the wall section with the circuit section.

Application Example 5

In the physical quantity sensor according to the application example of the invention, it is preferable that the diaphragm section includes a layer that is configured of a material which has a lower etching rate with respect to an acid etchant than the insulation layer.

With this configuration, when an insulation layer formed integrally with the insulation layer that is included in the circuit section is etched by using the acid etchant and forms the cavity (wall section), it is possible to use such a layer as an etching stop layer. Therefore, it is possible to efficiently form the diaphragm section having a desired thickness.

Application Example 6

In the physical quantity sensor according to the application example of the invention, it is preferable that the diaphragm section includes a layer that is configured of a material which has a lower etching rate with respect to an alkali etchant than the semiconductor substrate.

With this configuration, when the semiconductor substrate is etched by using the alkali etchant from the side opposite to the wall section and forms the diaphragm section, it is possible to use such a layer as an etching stop layer. Therefore, it is possible to efficiently form the diaphragm section having a desired thickness.

Application Example 7

In the physical quantity sensor according to the application example of the invention, it is preferable that the diaphragm section includes at least one film of a silicon oxide film, a silicon nitride film, and a metal film.

With this configuration, the insulation layer that is included in the circuit section is generally configured of the silicon oxide film, but the silicon nitride film has a lower etching rate with respect to the acid etchant than the silicon oxide film. Thus, when an insulation layer formed integrally with the insulation layer that is included in the circuit section is etched by using the acid etchant and forms the cavity (wall section), it is possible to use the silicon nitride film as an etching stop layer.

In addition, the silicon oxide film, the silicon nitride film, and the metal film all have a lower etching rate with respect to the alkali etchant than silicon. Thus, when the silicon substrate (semiconductor substrate) is etched by using the alkali etchant from the side opposite to the wall section, and forms the diaphragm section, it is possible to use these films as the etching stop layer.

In addition, the silicon oxide film and the silicon nitride film have relatively high insulation properties. Thus, the sensor element is disposed on these films, and therefore it is possible to prevent a short circuit of the wiring drawn out from each section of the sensor element or the sensor element.

Application Example 8

In the physical quantity sensor according to the application example of the invention, it is preferable that the inside of the cavity is depressurized to be below atmospheric pressure.

With this configuration, it is possible to use the physical quantity sensor as a so-called absolute pressure sensor.

Application Example 9

This application example is directed to a pressure sensor including: the physical quantity sensor according to the application examples of the invention.

With this configuration, it is possible to provide a pressure sensor that includes the physical quantity sensor which is intended to achieve a low profile and to lower cost.

Application Example 10

This application example is directed to an altimeter including: the physical quantity sensor according to the application examples of the invention.

With this configuration, it is possible to provide an altimeter that includes the physical quantity sensor which is intended to achieve a low profile and to lower cost.

Application Example 11

This application example is directed to an electronic apparatus including: the physical quantity sensor according to the application examples of the invention.

With this configuration, it is possible to provide an electronic apparatus that includes the physical quantity sensor which is intended to achieve a low profile and to lower cost.

Application Example 12

This application example is directed to a moving object including: the physical quantity sensor according to the application examples of the invention.

With this configuration, it is possible to provide a moving object that includes the physical quantity sensor which is intended to achieve a low profile and to lower cost.

BRIEF DESCRIPTION OF THE DRAWINGS

The invention will be described with reference to the accompanying drawings, wherein like numbers reference like elements.

FIG. 4A is a cross-sectional view illustrating a pressurized state, and FIG. 4B is a plan view illustrating the pressurized state.

DESCRIPTION OF EXEMPLARY EMBODIMENTS

Hereinafter, a physical quantity sensor, a pressure sensor, an altimeter, an electronic apparatus, and a moving object according to the invention will be described in detail in accordance with each embodiment illustrated in the accompanying drawings.

First Embodiment

1. Physical Quantity Sensor

Figure 1:
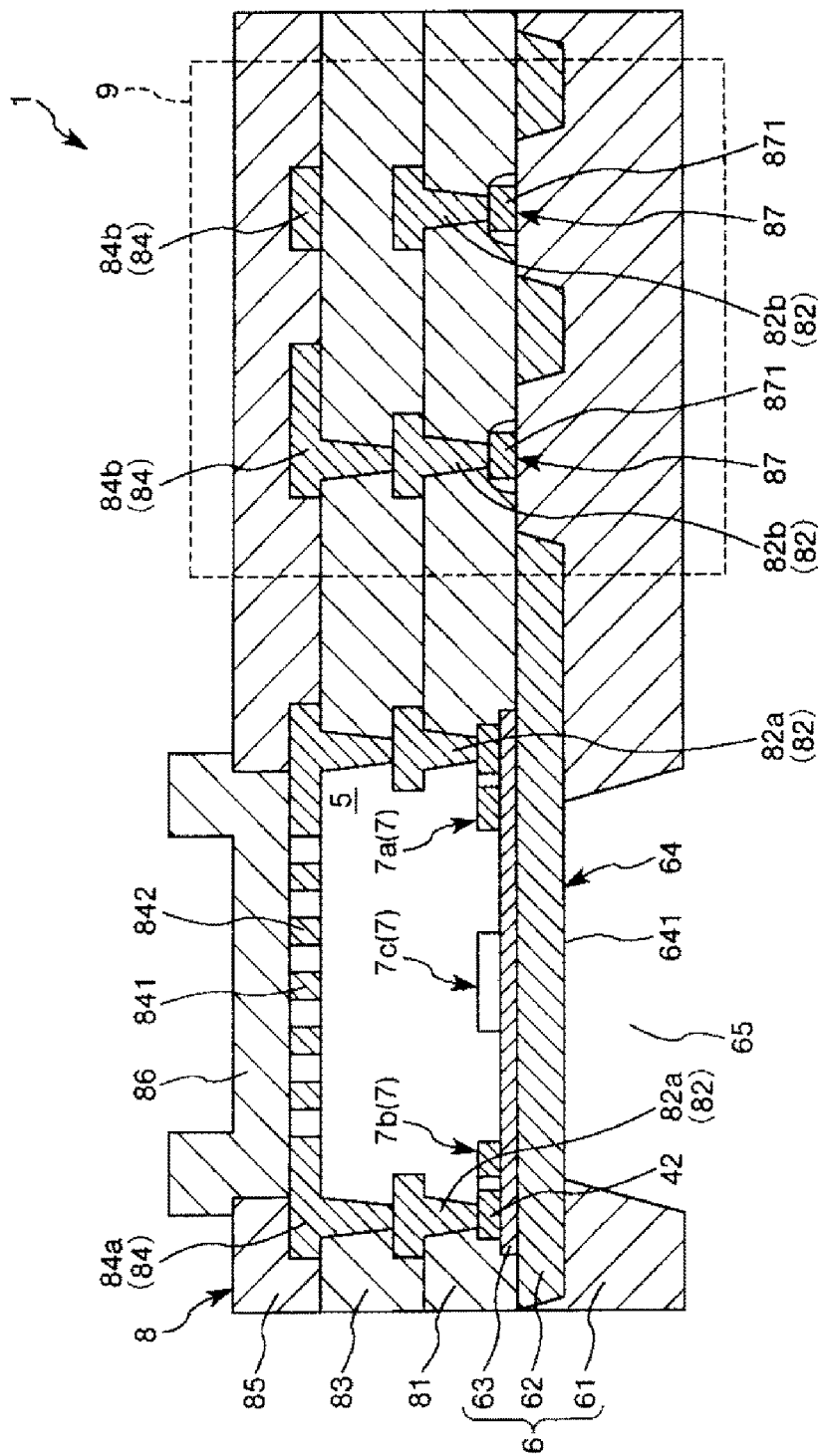
FIG. 1 is a cross-sectional view illustrating a first embodiment of a physical quantity sensor according to the invention.
Figure 2:
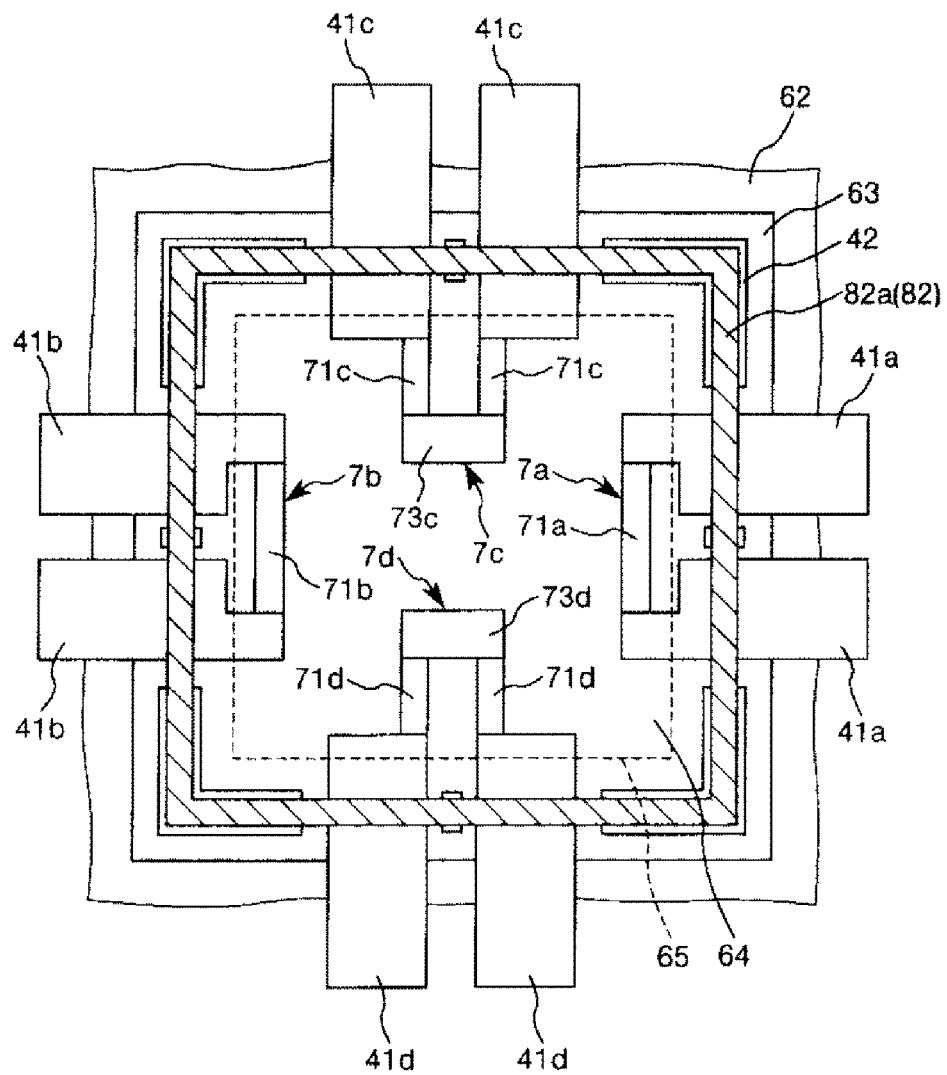
FIG. 2 is an enlarged plan view of a diaphragm section and a portion in the vicinity of the diaphragm section of the physical quantity sensor illustrated in FIG. 1.
Figure 3:
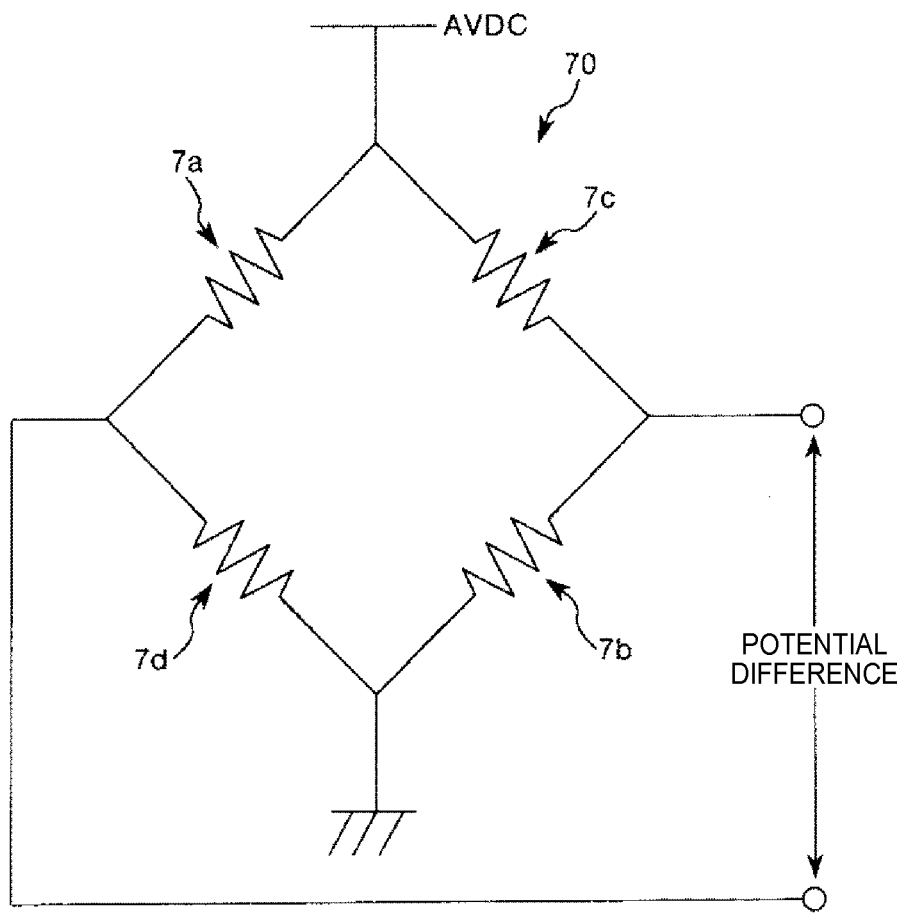
FIG. 3 is a view illustrating a bridge circuit that includes a sensor element (piezoresistive element) that is included in the physical quantity sensor illustrated in FIG. 1.
Figure 4A:
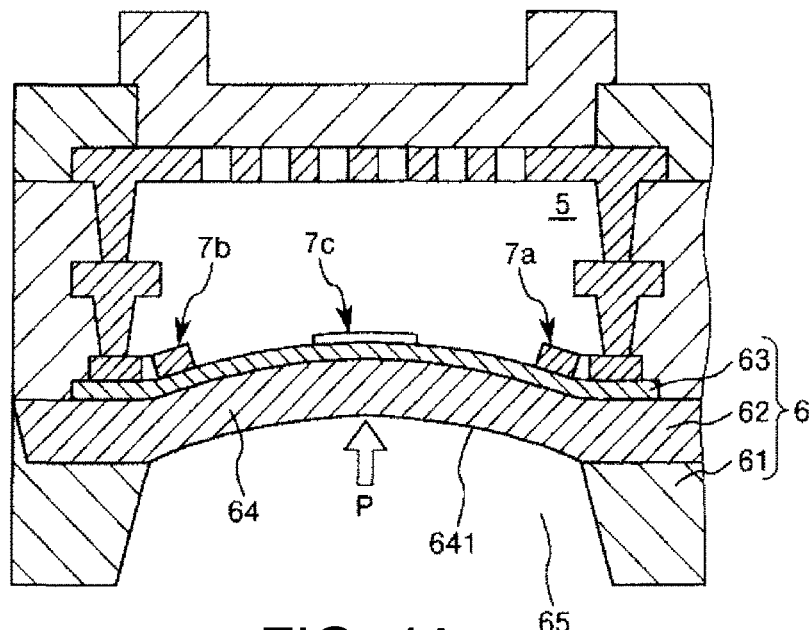
FIGS. 4A and 4B are views for illustrating an operation of the physical quantity sensor illustrated in FIG. 1.
Figure 4B:
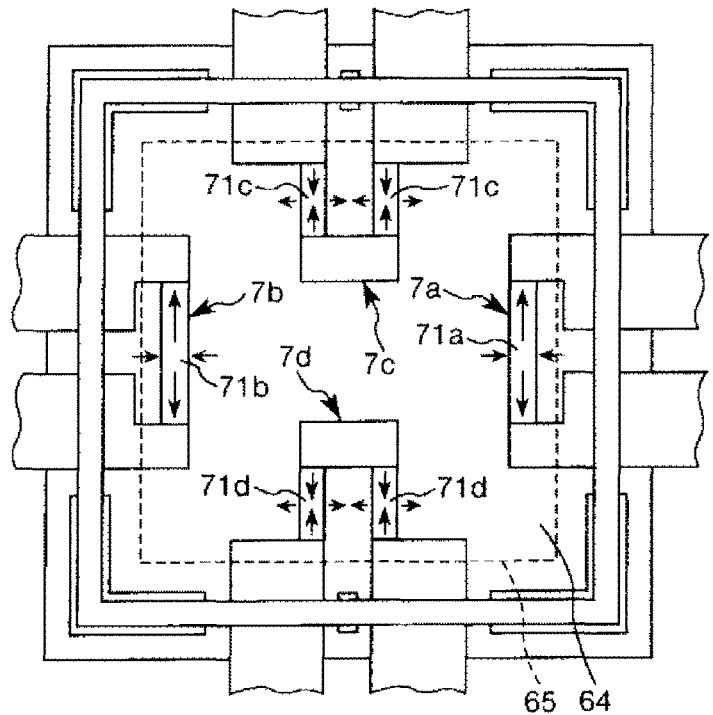

FIG. 1 is a cross-sectional view illustrating a first embodiment of the physical quantity sensor according to the invention. FIG. 2 is an enlarged plan view of a diaphragm section and a portion in the vicinity of the diaphragm section of the physical quantity sensor illustrated in FIG. 1. FIG. 3 is a view illustrating a bridge circuit that includes a sensor element (piezoresistive element) that is included in the physical quantity sensor illustrated in FIG. 1. In addition, FIGS. 4A and 4B are views for illustrating an operation of the physical quantity sensor illustrated in FIG. 1. FIG. 4A is a cross-sectional view illustrating a pressurized state, and FIG. 4B is a plan view illustrating the pressurized state.

A physical quantity sensor 1 illustrated in FIG. 1 includes a substrate 6, a sensor element 7, an element-periphery structure member 8, a cavity section 5 (cavity), and a semiconductor circuit 9 (circuit section). Each of the above members is described in the above order.

Substrate 6

The substrate 6 has a plate-like shape, and is configured to have a semiconductor substrate 61 that is configured of a semiconductor such as silicon, a silicon oxide film 62 that is provided on one surface of the semiconductor substrate 61, and a silicon nitride film 63 that is provided on the silicon oxide film 62. The shape of such a substrate 6 in a plan view is not limited and, for example, can be a quadrilateral such as substantially a square or substantially a rectangle or a circle. Here, the silicon oxide film 62 and the silicon nitride film 63 can both be used as an insulation film.

In addition, a diaphragm section 64 that is formed to be thinner than the periphery and flexurally deformed when receiving pressure is provided on the substrate 6. The diaphragm section 64 is formed to have a bottomed concave section 65 provided on the underside of the substrate 6. The underside of such a diaphragm section 64 has a pressure receiving surface 641. As illustrated in FIG. 2, the diaphragm section 64 is a square in a plan view.

The diaphragm section 64 is disposed on the semiconductor substrate 61. In the substrate 6 according to the present embodiment, the concave section 65 penetrates the semiconductor substrate 61, and the diaphragm section 64 is configured to have two layers of the silicon oxide film 62 and the silicon nitride film 63. Such a diaphragm section 64 may be extremely thin. Therefore, the physical quantity sensor 1 has extremely high sensitivity. In addition, these films can be used as an etching stop layer when manufacturing the physical quantity sensor 1, as will be described later, and it is possible to decrease variations in the thickness of the diaphragm section 64 for each product.

The concave section 65 does not penetrate the semiconductor substrate 61, and the diaphragm section 64 may be configured to have three layers of a thin portion of the semiconductor substrate 61, the silicon oxide film 62, and the silicon nitride film 63.

Sensor Element 7

The sensor element 7 is configured to have a plurality (four in the embodiment) of piezoresistive elements 7a, 7b, 7c, and 7d which is provided on the diaphragm section 64 of the substrate 6, as illustrated in FIG. 2.

The piezoresistive elements 7a and 7b are provided to correspond to one pair of opposite (parallel in a horizontal direction in FIG. 2) sides (hereinafter, also referred to as "first sides") of the diaphragm section 64 that is a quadrilateral in a plan view. The piezoresistive elements 7c and 7d are provided to correspond to the other pair of opposite (parallel in a vertical direction in FIG. 2) sides (hereinafter, also referred to as "second sides") of the diaphragm section 64 that is a quadrilateral in a plan view.

The piezoresistive element 7a has a piezoresistive portion 71a provided in the vicinity of the outer circumference of the diaphragm section 64 (more specifically, in the vicinity of a first side on the right side in FIG. 2). The piezoresistive portion 71a has a longitudinal shape extending along a direction parallel to the first sides. Wirings 41a are connected to the opposite ends of the piezoresistive portion 71a, respectively.

Similarly, the piezoresistive element 7b has a piezoresistive portion 71b provided in the vicinity of the outer circumference of the diaphragm section 64 (more specifically, in the vicinity of a first side on the left side in FIG. 2). Wirings 41b are connected to the opposite ends of the piezoresistive portion 71b, respectively.

Meanwhile, the piezoresistive element 7c has a pair of piezoresistive portions 71c provided in the vicinity of the outer circumference of the diaphragm section 64 (more specifically, in the vicinity of a second side on the upper side in FIG. 2) and a connection portion 73c that connects the pair of piezoresistive portions 71c to each other. The pair of piezoresistive portions 71c is parallel to each other, and has a longitudinal shape extending along a direction perpendicular to the second sides (that is, a direction parallel to the first sides). Ends on one side of the pair of piezoresistive portions 71c (ends on the center side of the diaphragm section 64) are connected to each other through the connection portion 73c, and wirings 41c are connected to ends on the other side of the pair of piezoresistive portions 71c (ends on the outer circumferential side of the diaphragm section 64), respectively.

Similarly, the piezoresistive element 7d has a pair of piezoresistive portions 71d provided in the vicinity of the outer circumference of the diaphragm section 64 (more specifically, in the vicinity of a second side on the lower side in FIG. 2) and a connection portion 73d that connects the pair of piezoresistive portions 71d to each other. Ends on one side of the pair of piezoresistive portions 71d (ends on the center side of the diaphragm section 64) are connected to each other through the connection portion 73d, and wirings 41d are connected to ends on the other side of the pair of piezoresistive portions 71d (ends on the outer circumferential side of the diaphragm section 64), respectively.

The piezoresistive portions 71a, 71b, 71c, and 71d of such piezoresistive elements 7a, 7b, 7c, and 7d are each configured of polysilicon (polycrystalline silicon) doped (dispersed or implanted) with impurities such as phosphorus or boron. In addition, the connection portions 73c and 73d of the piezoresistive elements 7c and 7d and the wirings 41a, 41b, 41c, and 41d are configured of polysilicon (polycrystalline silicon) doped (dispersed or implanted) with impurities such as phosphorus or boron at a higher concentration than in the piezoresistive portions 71a, 71b, 71c, and 71d. The connection portions 73c and 73d and the wirings 41a, 41b, 41c, and 41d may be configured of a metal.

In addition, the piezoresistive elements 7a, 7b, 7c, and 7d are configured so as to have equal resistance values to each other in theory. The piezoresistive elements 7a, 7b, 7c, and 7d are electrically connected to each other through the wirings 41a, 41b, 41c, and 41d, and configure a bridge circuit 70 (Wheatstone bridge circuit) as illustrated in FIGS. 4A and 4B. A drive circuit (not illustrated) that supplies a drive voltage AVDC is connected to the bridge circuit 70. The bridge circuit 70 outputs a signal (voltage) in accordance with the resistance values of the piezoresistive elements 7a, 7b, 7c, and 7d.

In addition, even though such a sensor element 7 uses an extremely thin diaphragm section 64 as described above, there is no problem occurring in which a Q value decreases due to vibration leakage to the diaphragm section 64 unlike in a case where a vibration element such as a resonator is used as the sensor element.

Element-Periphery Structure Member 8

The element-periphery structure member 8 is formed to partition the cavity section 5 in which the sensor element 7 is disposed. Here, the element-periphery structure member 8 is disposed on one surface side of the semiconductor substrate 61 and configures a "wall section" that forms a cavity section 5 together with the diaphragm section 64.

The element-periphery structure member 8 includes an inter-layer insulation film 81 formed so as to surround the sensor element 7 on the substrate 6, a wiring layer 82 formed on the inter-layer insulation film 81, an inter-layer insulation film 83 formed on the wiring layer 82 and the inter-layer insulation film 81, a wiring layer 84 that is formed on the inter-layer insulation film 83 and has a covering layer 841 in which a plurality of fine holes (open holes) is provided, a front surface protective film 85 formed on the wiring layer 84 and the inter-layer insulation film 83, and a sealing layer 86 provided on the covering layer 841. Here, the wiring layers 82 and 84 include wiring layers 82a and 84a which are formed so as to surround the cavity section 5, and wiring layers 82b and 84b which configure the wiring of the semiconductor circuit 9. In addition, a layer 42 is provided between the wiring layer 82a and the silicon nitride film 63. The layer 42 is formed collectively with the sensor element 7 as will be described later, but may not be provided. In addition, a part of the inter-layer insulation film 81 is interposed between the wiring layer 82a and the silicon nitride film 63, which is not illustrated.

The semiconductor circuit 9 is fabricated on and above the semiconductor substrate 61. Thus, the semiconductor circuit 9 is provided on the same surface side as the element-periphery structure member 8 of the semiconductor substrate 61. The semiconductor circuit 9 includes an active element such as a MOS transistor 87, and other circuit components such as a capacitor, an inductor, a resistor, a diode, and a wiring (including the wiring that is connected to the sensor element 7 and wiring layers 82b and 84b) which are formed, as necessary. Here, the MOS transistor 87 includes a source and a drain (not illustrated) which are doped with impurities such as phosphorus or boron and formed on the top surface of the semiconductor substrate 61, a gate insulation film (not illustrated) formed on a channel region that is formed between the source and the drain, and a gate electrode 871 formed on the gate insulation film.

Cavity Section 5

The cavity section 5 partitioned by the substrate 6 and the element-periphery structure member 8 functions as an accommodation section in which the sensor element 7 is accommodated. In addition, the cavity section 5 is a sealed space. The cavity section 5 functions as a pressure reference chamber to provide a reference value of pressure detected by the physical quantity sensor 1. According to the embodiment, the cavity section 5 is in a vacuum state (300 Pa or lower). The cavity section 5 is in the vacuum state, and therefore it is possible to use the physical quantity sensor 1 as an "absolute pressure sensor" that detects pressure with the vacuum state as a reference, and thus its convenience is improved.

However, the cavity section 5 may not have the vacuum state, but instead may be at atmospheric pressure, a depressurized state in which air pressure is lower than atmospheric pressure, or a pressurized state in which air pressure is higher than atmospheric pressure. In addition, an inert gas such as a nitrogen gas or a rare gas may be sealed in the cavity section 5.

As above, the configuration of the physical quantity sensor 1 has been concisely described.

In the physical quantity sensor 1 having such a configuration, the diaphragm section 64 is deformed in accordance with the pressure that is received by the pressure receiving surface 641 of the diaphragm section 64 as illustrated in FIG. 4A, therefore the piezoresistive elements 7a, 7b, 7c, and 7d are strained as illustrated in FIG. 4B, and the resistance values of the piezoresistive elements 7a, 7b, 7c, and 7d are changed. Accordingly, an output of the bridge circuit 70 (see FIG. 3) that is configured to have the piezoresistive elements 7a, 7b, 7c, and 7d is changed, and thus it is possible to obtain the magnitude of the pressure received by the pressure receiving surface 641 based on the output.

To be more specific, since the resistance values of the piezoresistive elements 7a, 7b, 7c, and 7d are equal to each other as described above, the product of the resistance values of the piezoresistive elements 7a and 7b is equal to the product of the resistance values of the piezoresistive elements 7c and 7d in theory before the diaphragm section 64 is deformed as described above, and thus the output (potential difference) of the bridge circuit 70 should be zero.

Meanwhile, when the diaphragm section 64 is deformed as described above as illustrated in FIG. 4B, the piezoresistive portions 71a and 71b of the piezoresistive elements 7a and 7b are subjected to a tensile strain along the longitudinal direction thereof and to a compression strain along the width direction thereof, and simultaneously the piezoresistive portions 71c and 71d of the piezoresistive elements 7c and 7d are subjected to a compression strain along the longitudinal direction thereof and to a tensile strain along the width direction thereof.

Here, the deformation of the diaphragm section 64 as described above causes the piezoresistive portions 71a and 71b to receive the compression force in the width direction thereof, but the piezoresistive portions 71a and 71b are subjected to the tensile strain along the longitudinal direction thereof in accordance with Poisson's ratio of the piezoresistive portions 71a and 71b. In addition, the deformation of the diaphragm section 64 as described above causes the piezoresistive portions 71c and 71d to receive the compression force in the longitudinal direction thereof, and the piezoresistive portions 71c and 71d are subjected to the compression strain along the longitudinal direction thereof in accordance with the compression force.

The strain of the piezoresistive portions 71a, 71b, 71c, and 71d causes a difference to occur between the product of resistance values of the piezoresistive elements 7a and 7b and the product of resistance values of the piezoresistive elements 7c and 7d, and an output (potential difference) in accordance with the difference is output from the bridge circuit 70. It is possible to obtain the magnitude (absolute pressure) of the pressure received by the pressure receiving surface 641 based on the output from the bridge circuit 70.

Here, when the diaphragm section 64 is deformed as described above, the resistance values of the piezoresistive elements 7a and 7b are increased and the resistance values of the piezoresistive elements 7c and 7d are decreased. Therefore, it is possible to significantly change the difference between the product of the resistance values of the piezoresistive elements 7a and 7b and the product of the resistance values of the piezoresistive elements 7c and 7d, and thus it is possible to increase the output from the bridge circuit 70. As a result, it is possible to increase pressure detection sensitivity. In addition, since all of the piezoresistive elements 7a, 7b, 7c, and 7d that configure the bridge circuit 70 have substantially the same temperature sensitivity, it is possible to decrease characteristic changes depending on an external temperature change.

In the physical quantity sensor 1 as described above, the cavity section 5 and the semiconductor circuit 9 are provided on the same surface side of the semiconductor substrate 61. Therefore, the element-periphery structure member 8 that forms the cavity section 5 does not stick out from the side opposite to the semiconductor circuit 9 of the semiconductor substrate 61, and thus it is possible to achieve a low profile. Thus, the element-periphery structure member 8 is formed through the same film formation as at least one of the inter-layer insulation films 81 and 83 and the wiring layers 82 and 84. Accordingly, the CMOS process (particularly a process of forming the inter-layer insulation films 81 and 83 and the wiring layers 82 and 84) is used, and it is possible to collectively form the element-periphery structure member 8 with the semiconductor circuit 9. Therefore, the manufacturing process of the physical quantity sensor 1 is simplified, and as a result, it is possible to lower cost of the physical quantity sensor 1. In addition, even in a case where the cavity section 5 is sealed as in the embodiment, it is possible to seal the cavity section 5 using a film formation method and thus there is no need to bond substrates so as to seal the cavity as in the related art. In this point, the manufacturing process of the physical quantity sensor 1 is simplified, and as a result, it is possible to lower the cost of the physical quantity sensor 1.

In addition, the sensor element 7 includes the piezoresistive elements 7a, 7b, 7c, and 7d as described above, and the sensor element 7 and the semiconductor circuit 9 are disposed on the same surface side of the semiconductor substrate 61. Therefore, the CMOS process (particularly, a process of forming the transistor 87) is used, and it is possible to collectively form the sensor element 7 with the semiconductor circuit 9. Therefore, in this point, it is possible to further simplify the manufacturing process of the physical quantity sensor 1.

In addition, since the sensor element 7 is disposed on the element-periphery structure member 8 side of the diaphragm section 64, it is possible to accommodate the sensor element 7 inside the cavity section 5, and thus it is possible to prevent the sensor element 7 from degrading or in other words to decrease the characteristic degradation of the sensor element 7.

In addition, the diaphragm section 64 includes the silicon nitride film 63 as a layer that is configured of a material which has a lower etching rate with respect to an acid etchant than the inter-layer insulation films 81 and 83.

In general, the inter-layer insulation films 81 and 83 included in the semiconductor circuit 9 are configured to have the silicon oxide film, however, the silicon nitride film has a lower etching rate with respect to the acid etchant than the silicon oxide film. Accordingly, when an insulation layer formed integrally with the inter-layer insulation films 81 and 83 that are included in the semiconductor circuit 9 is etched by using the acid etchant and forms the cavity section 5 (element-periphery structure member 8), it is possible to use such a layer (silicon nitride film 63) as an etching stop layer. Therefore, it is possible to efficiently form the diaphragm section 64 having a desired thickness.

In addition, the diaphragm section 64 includes the silicon oxide film 62 and the silicon nitride film 63 as layers that are configured of materials that have a lower etching rate with respect to an alkali etchant than the semiconductor substrate 61.

Accordingly, the silicon oxide film 62 and the silicon nitride film 63 all have a lower etching rate with respect to the alkali etchant than silicon. Thus, when the semiconductor substrate 61 is etched by using the alkali etchant from the side opposite to the element-periphery structure member 8, and forms the diaphragm section 64, it is possible to use these layers (silicon oxide film 62 according to the embodiment) as the etching stop layer. Therefore, in this point, it is possible to efficiently form the diaphragm section 64 having the desired thickness.

In addition, the silicon oxide film 62 and the silicon nitride film 63 have relatively high insulation properties. Thus, the sensor element 7 is disposed on these films (silicon nitride film 63 according to the embodiment), and thus it is possible to prevent a short circuit of the wiring drawn out from each section of the sensor element 7 or the sensor element 7.

Next, a manufacturing method of the physical quantity sensor 1 will be described concisely.

FIGS. 5A to 6D are views illustrating the manufacturing process of the physical quantity sensor illustrated in FIG. 1. Hereinafter, description is provided with reference to these drawings.

Sensor Element•MOS Transistor Forming Processes

Figure 5A:
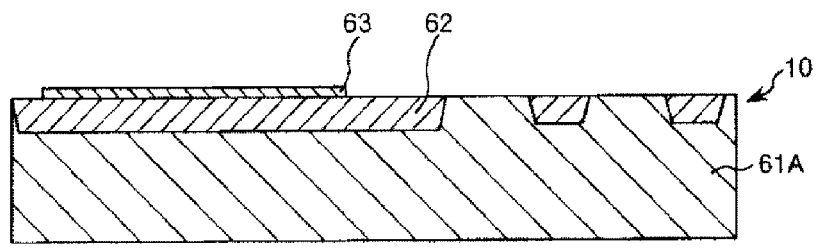
FIGS. 5A to 5D are views illustrating a manufacturing process of the physical quantity sensor illustrated in FIG. 1.

First, as illustrated in FIG. 5A, the top surface of the semiconductor substrate 61A such as a silicon substrate is thermally oxidized such that the silicon oxide film 62 is formed, and further, the silicon nitride film 63 is formed on the silicon oxide film 62 by using a sputtering method, a CVD method, or the like. Accordingly, a structure member 10 is obtained.

The silicon oxide film 62 functions as an inter-element separating film when the semiconductor circuit 9 is formed on and above the semiconductor substrate 61. In addition, the silicon nitride film 63 has resistance to etching in a cavity section forming process which will be performed later, and functions as an etching stop layer. The silicon nitride film 63 is formed to be restricted in a range including a plane range in which the sensor element 7 is formed and a range of a part of element (capacitor) or the like in the semiconductor circuit 9, by a patterning process. Accordingly, there is no obstruction encountered when the semiconductor circuit 9 is formed on and above the semiconductor substrate 61.

In addition, the gate insulation film of the MOS transistor 87 is formed by thermal-oxidation and the source and drain of the MOS transistor 87 of the semiconductor circuit 9 is formed by being doped with impurities such as phosphorus or boron on a portion on the top surface of the semiconductor substrate 61A, where the silicon oxide film 62 and the silicon nitride film 63 are not formed (not illustrated).

Figure 5B:
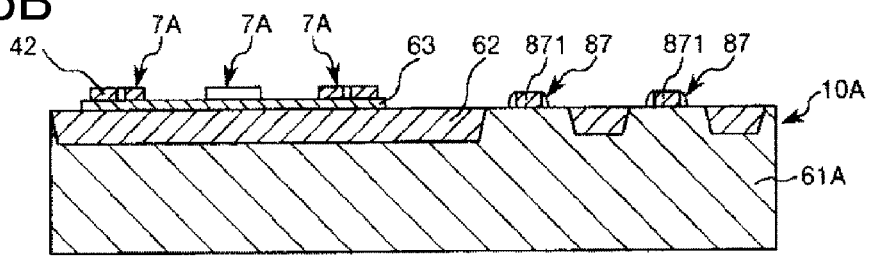

Next, a polycrystalline silicon film (or amorphous silicon film) is formed on the top surface of the structure member 10 by using the sputtering method, the CVD method, or the like, the polycrystalline silicon film is patterned by etching, and an element forming film 7A, the layer 42, and the gate electrode 871 for forming the sensor element 7 are formed as illustrated in FIG. 5B. Accordingly, a structure member 10A including the element forming film 7A and the MOS transistor 87 is obtained.

Here, a thickness of the polycrystalline silicon film is not particularly limited, but, for example, is about 200 nm to 400 nm.

Figure 5C:
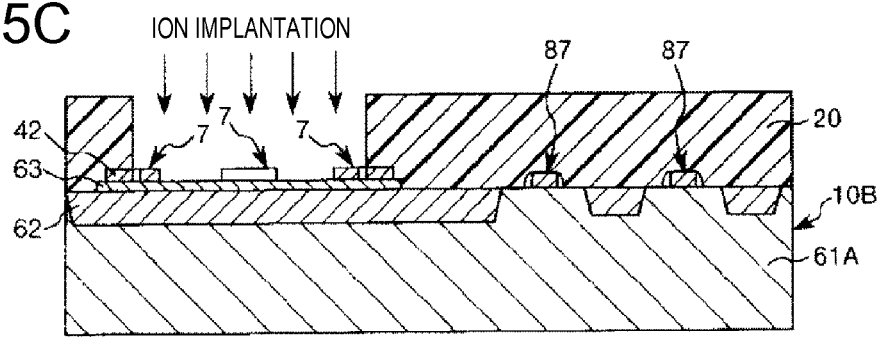

Next, after a photoresist film 20 is formed on a part of the top surface of the structure member 10A so as to expose the element forming film 7A, impurities such as phosphorus or boron dope (are ion-implanted on) the element forming film 7A, and then the sensor element 7 is formed as illustrated in FIG. 5C. Accordingly, a structure member 10B including the sensor element 7 and the MOS transistor 87 is obtained.

During the ion implantation, the shape of the photoresist film 20, the conditions of ion implantation, or the like are adjusted such that a doping amount of impurities implanted into the piezoresistive portions 71a, 71b, 71c, and 71d is greater than that implanted into the connection portions 73c and 73d and the wirings 41a, 41b, 41c, and 41d.

For example, in the case where an ion implantation of boron is performed at 17 keV, an ion implanting concentration implanted into the piezoresistive portions 71a, 71b, 71c, and 71d is about $1 \times 10^{13}$ atoms/cm$^2$ to $1 \times 10^{15}$ atoms/cm$^2$, and the ion implanting concentration implanted into the connection portions 73c and 73d and the wirings 41a, 41b, 41c, and 41d is about $1 \times 10^{15}$ atoms/cm$^2$ to $5 \times 10^{15}$ atoms/cm$^2$.

Inter-Layer Insulation Film•Wiring Layer Forming Processes

Figure 5D:
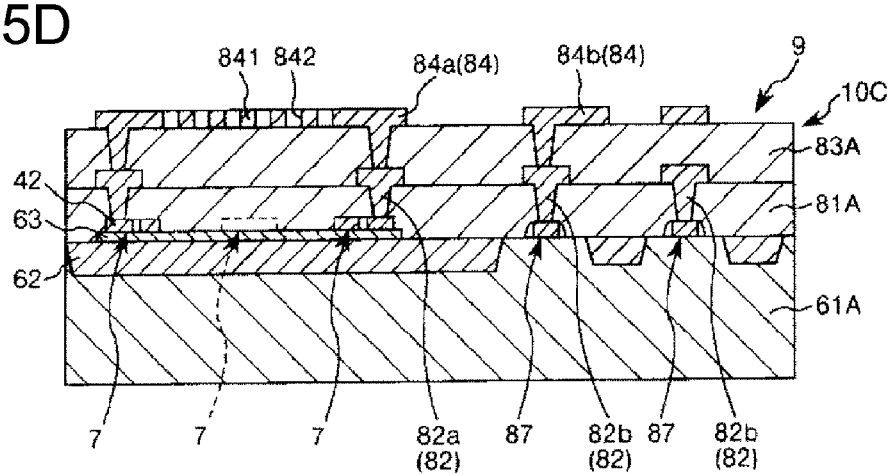

Inter-layer insulation films 81A and 83A and the wiring layers 82 and 84 are formed on the top surface of the structure member 10B obtained in the above-described process, as illustrated in FIG. 5D. Accordingly, a structure member 10C is obtained, in which the sensor element 7 and the MOS transistor 87 cover the inter-layer insulation films 81A and 83A and the wiring layers 82 and 84.

The silicon oxide film is formed by using the sputtering method, the CVD method, or the like and the silicon oxide film is patterned by etching such that formation of the inter-layer insulation films 81A and 83A is performed.

Here, each thickness of the inter-layer insulation films 81A and 83A is not particularly limited, but, for example, is about 1500 nm to 5000 nm.

In addition, after a layer made of, for example, aluminum is formed on the inter-layer insulation films 81A and 83A by using the sputtering method, the CVD method, or the like, the layer is patterned such that formation of the wiring layers 82 and 84 is performed.

Here, each thickness of the wiring layers 82 and 84 is not particularly limited, but, for example, is about 300 nm to 900 nm.

In addition, the wiring layers 82a and 84a each have an annular shape to surround a plurality of sensor elements 7 in a plan view. In addition, the wiring layers 82b and 84b are electrically connected to a wiring (for example, wiring that configures a part of the semiconductor circuit 9) formed on and above the semiconductor substrate 61.

A stacking structure of such inter-layer insulation films and wiring layers is formed by using a common CMOS process, and the number of stacked layers is appropriately set, as necessary. That is, more wiring layers are stacked through the inter-layer insulation films, as necessary, in some cases.

Cavity Section Forming Process

Figure 6A:
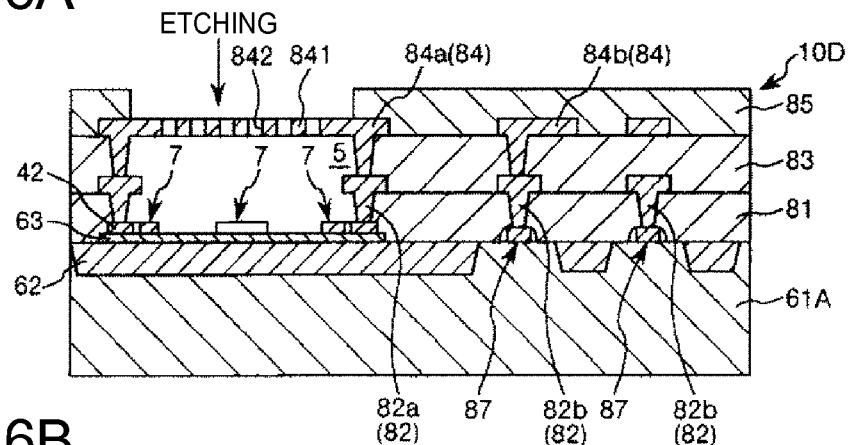
FIGS. 6A to 6D are views illustrating the manufacturing process of the physical quantity sensor illustrated in FIG. 1.

After the front surface protective film 85 is formed on the top surface of the structure member 10D obtained in the above-described process by using the sputtering method, the CVD method, or the like, as illustrated in FIG. 6A, the cavity section 5 is formed by etching. Accordingly, a structure member 10D including the cavity section 5 is obtained.

The front surface protective film 85 is configured to have a plurality of film layers containing one or more types of materials and is formed such that a fine hole 842 of the covering layer 841 is not sealed. Examples of constituent materials of the front surface protective film 85 include a silicon oxide film, a silicon nitride film, a polyimide film, an epoxy resin film, or the like, which has resistance against moisture, dust, a defect, or the like so as to protect the element.

Here, the thickness of the front surface protective film 85 is not particularly limited, but, for example, is about 500 nm to 2000 nm.

In addition, apart of the inter-layer insulation films 83A and 85A is removed by etching through a plurality of fine holes 842 formed in the covering layer 841 such that formation of the cavity section 5 is performed. Here, in the case where wet etching is used as such etching, an etchant of hydrofluoric acid, buffered hydrofluoric acid, or the like is supplied from the plurality of fine holes 842, and in the case where dry etching is used, an etching gas of hydrofluoric acid gas, or the like is supplied from the plurality of fine holes 842.

Sealing Process

Figure 6B:
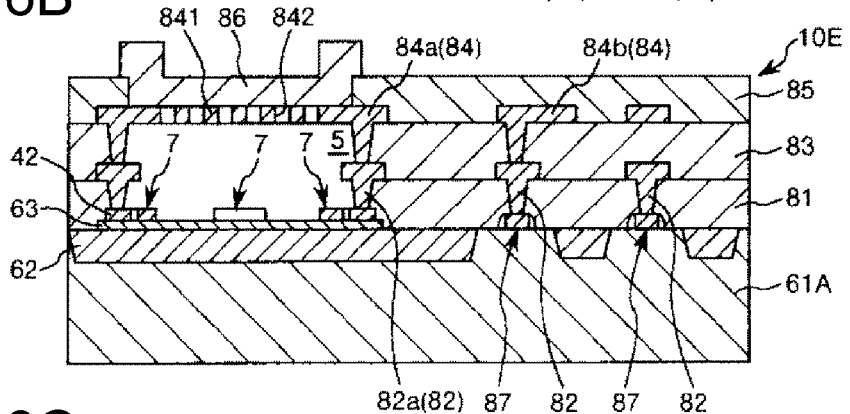

Next, the sealing layer 86 that is made of a silicon oxide film, a silicon nitride film, a metal film such as AL, Cu, W, Ti, TiN, or the like is formed on the covering layer 841 by using the sputtering method, the CVD method, or the like, as illustrated in FIG. 6B, and then each fine hole 842 is sealed. Accordingly, a structure member 10E is obtained, in which the cavity section 5 is sealed by the sealing layer 86.

Here, the thickness of the sealing layer 86 is not particularly limited, and, for example, is about 1000 nm to 5000 nm.

Diaphragm Forming Process

Figure 6C:
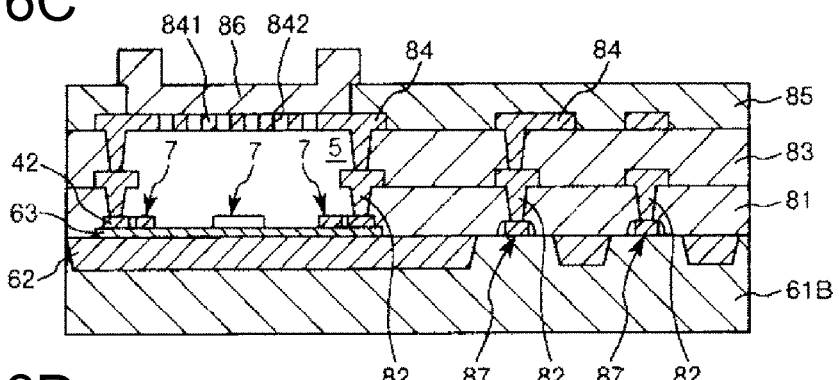
Figure 6D:
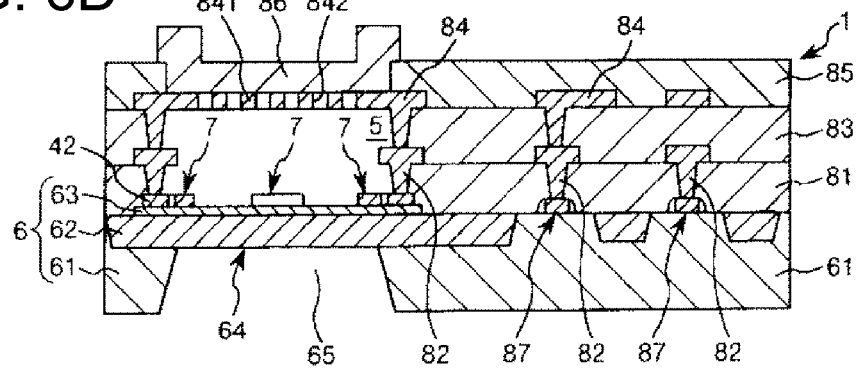

Finally, the underside of the semiconductor substrate 61A is ground, and a semiconductor substrate 61B that is thin throughout is obtained as illustrated in FIG. 6C. Then, a part of the underside of the semiconductor substrate 61B is further removed, for example, by dry etching as illustrated in FIG. 6D. Accordingly, the physical quantity sensor 1 is obtained, in which the diaphragm section 64 that is thinner than the periphery, is formed.

Here, a reduction in the thickness of the semiconductor substrate 61A by grinding is not particularly limited, but, for example, is about 100 μm to 400 μm.

In addition, when a part of the underside of the semiconductor substrate 61B is removed, the silicon oxide film 62 functions as an etching stop layer. Accordingly, it is possible to regulate the thickness of the diaphragm section 64 with high accuracy.

The method of removing a part of the underside of the semiconductor substrate 61B is not limited to dry etching, and may be wet etching or the like. In addition, in a case where the diaphragm section 64 includes a part of the semiconductor substrate 61, the thickness of the semiconductor substrate 61 in the portion may be about 80 μm or less.

It is possible to manufacture the physical quantity sensor 1 through such processes. It is possible to fabricate an active element other than the MOS transistor 87, and circuit components such as a capacitor, an inductor, a resistor, a diode, and a wiring that are included in the semiconductor circuit 9 during an appropriate process described above (for example, the vibration element forming process, the insulation film forming process, the covering layer forming process, or the sealing layer forming process). For example, it is possible to form an inter-circuit element separating film along with the silicon oxide film 62, to form the gate electrode, a capacitor electrode, a wiring, or the like along with the sensor element 7, to form the gate insulating film, a capacitor dielectric layer, and the inter-layer insulation film along with the inter-layer insulation films 81 and 83, and to form an intra-circuit wiring along with the wiring layers 82 and 84.

Second Embodiment

Next, a second embodiment of the physical quantity sensor according to the invention will be described.

Figure 7:
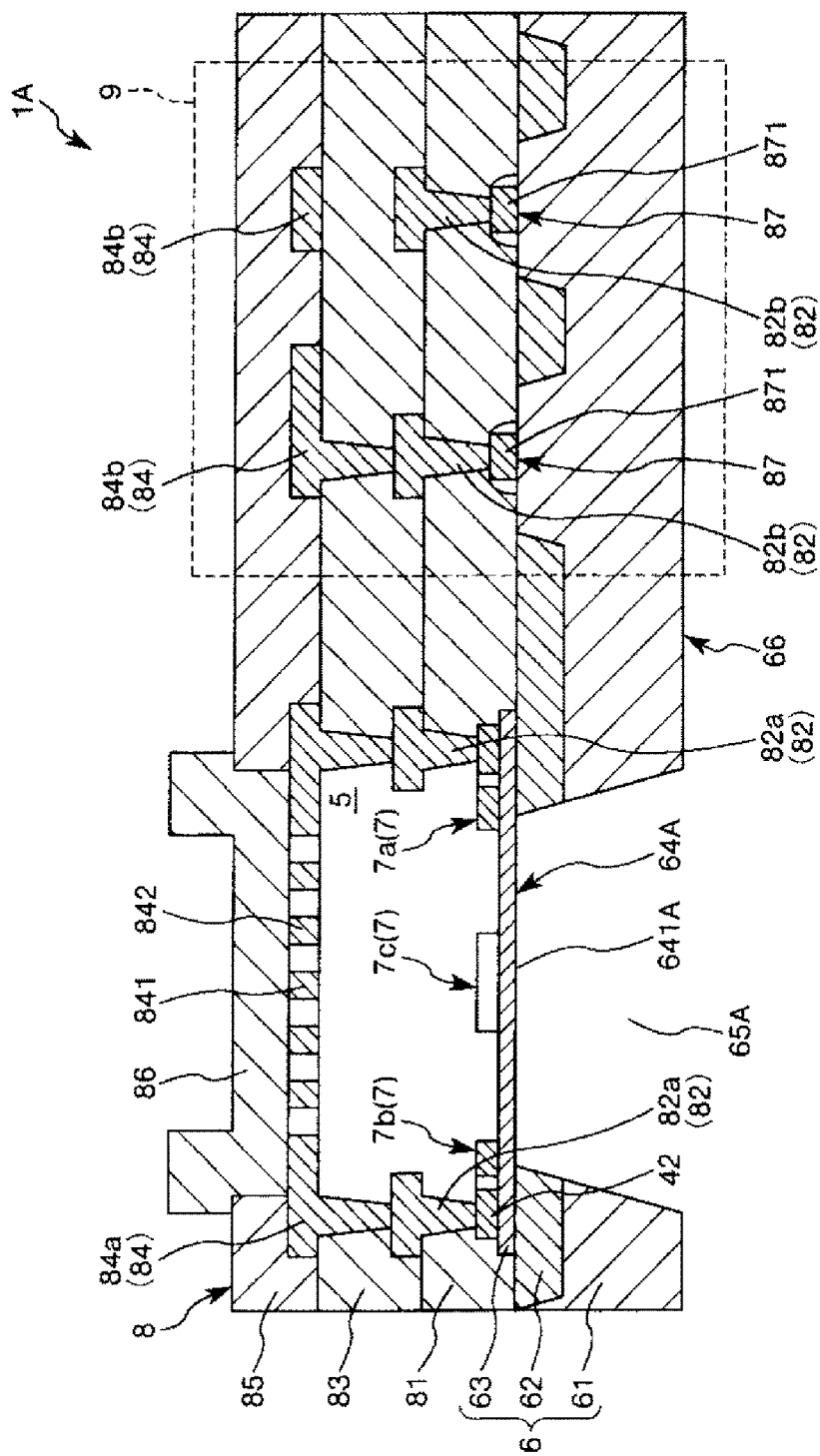
FIG. 7 is a cross-sectional view illustrating a second embodiment of a physical quantity sensor according to the invention.

FIG. 7 is a cross-sectional view illustrating the second embodiment of the physical quantity sensor according to the invention.

Hereinafter, the second embodiment of the physical quantity sensor according to the invention will be described, but differences from the above-described embodiment are focused on and described, and the descriptions of the same details are not repeated.

The second embodiment is the same as the above-described first embodiment except for the configuration of the diaphragm section.

A diaphragm section 64A that is included in a physical quantity sensor 1A illustrated in FIG. 7 is configured to have the silicon nitride film 63. The diaphragm section 64A is formed by providing a concave section 65A that penetrates the semiconductor substrate 61 and the silicon oxide film 62 on the underside of the substrate 6. In the diaphragm section 64A, the underside of the silicon nitride film 63 is a pressure receiving surface 641A.

The silicon nitride film 63 has a lower etching rate with respect to the alkali etchant than silicon. Thus, when the semiconductor substrate 61 is etched by using the alkali etchant from the side opposite to the element-periphery structure member 8, and forms the diaphragm section 64A, it is possible to use the silicon nitride film 63 as the etching stop layer.

In addition, the diaphragm section 64A is configured to have only the silicon nitride film 63, and thus it is possible to realize the extremely thin diaphragm section 64A.

It is possible to achieve the low profile and to lower the cost also by applying the physical quantity sensor 1A as described above.

Third Embodiment

Next, a third embodiment of a physical quantity sensor according to the invention will be described.

Figure 8:
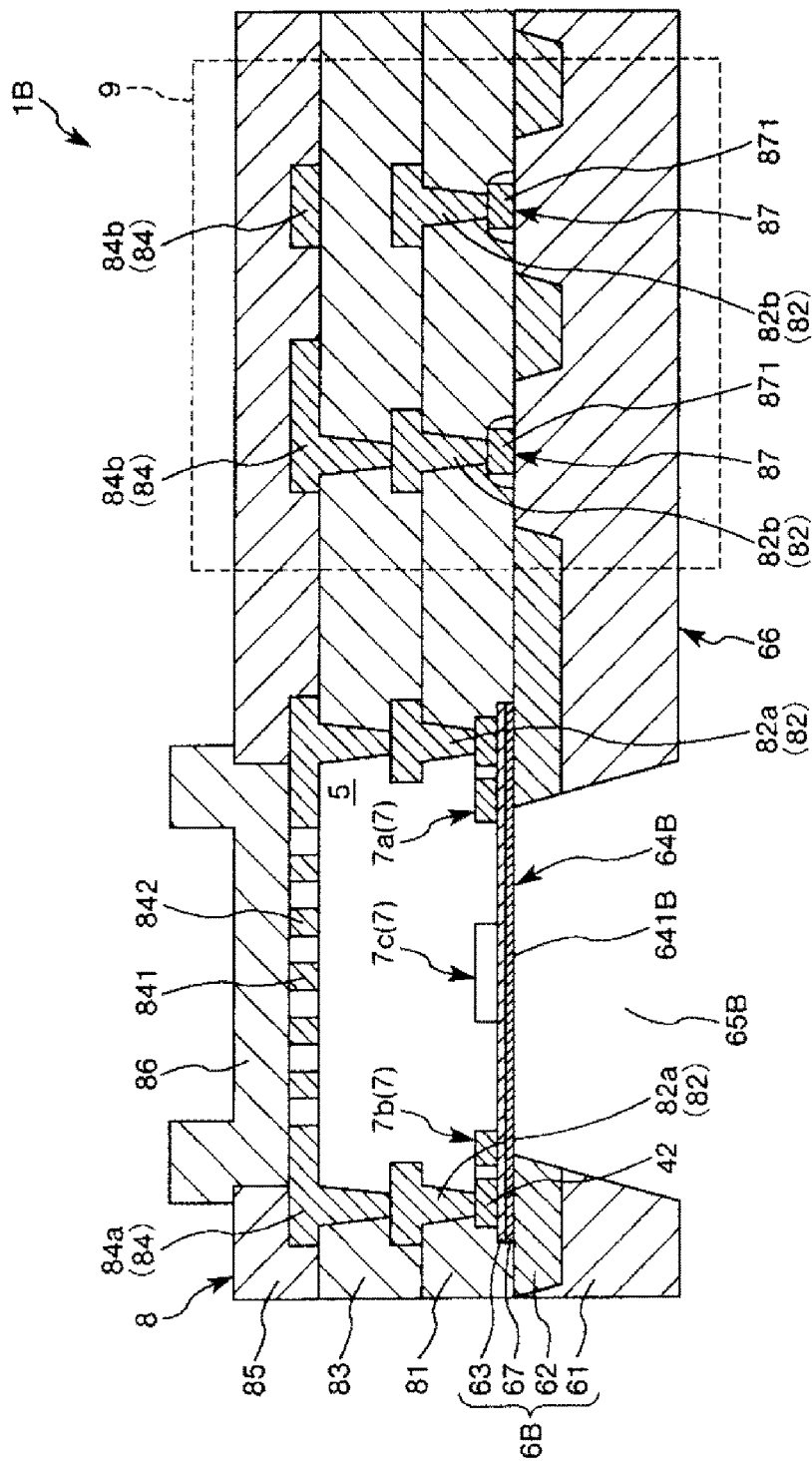
FIG. 8 is a cross-sectional view illustrating a third embodiment of a physical quantity sensor according to the invention.

FIG. 8 is a cross-sectional view illustrating the third embodiment of the physical quantity sensor according to the invention.

Hereinafter, the third embodiment of the physical quantity sensor according to the invention will be described, but differences from the above-described embodiment are focused on and described, and the descriptions of the same details are not repeated.

The third embodiment is the same as the above-described first embodiment except for the configuration of the diaphragm section.

A diaphragm section 64B that is included in a physical quantity sensor 1B illustrated in FIG. 8 is configured to have the silicon nitride film 63 and a metal film 67.

The metal film 67 is disposed between the silicon oxide film 62 and the silicon nitride film 63. A part of the silicon oxide film 62 may be left out in the vicinity of the diaphragm section 64B. In this case, the metal film 67 is to be disposed between the semiconductor substrate 61 and the silicon nitride film 63.

The diaphragm section 64B is formed by providing a concave section 65B that penetrates the semiconductor substrate 61 and the silicon oxide film 62 on the underside of the substrate 6B in which the semiconductor substrate 61, the silicon oxide film 62, the metal film 67, and the silicon nitride film 63 are stacked in the above order. In the diaphragm section 64B, the underside of the metal film 67 is a pressure receiving surface 641B.

The metal film 67 has a lower etching rate with respect to the alkali etchant than silicon. Thus, when the semiconductor substrate 61B is etched by using the alkali etchant from the side opposite to the element-periphery structure member 8, and forms the diaphragm section 64B, it is possible to use the metal film 67 as the etching stop layer.

In addition, the diaphragm section 64B is configured to have the silicon nitride film 63 and the metal film 67, and thus it is possible to realize the extremely thin diaphragm section 64B.

In addition, since the metal film 67 has good conductivity, it is possible to use the metal film 67 as a grounding link.

Constituent materials of such a metal film 67 are not particularly limited, and it is possible to use various metal materials. However, it is preferable that a wiring material such as aluminum or copper be used in terms of affinity with the CMOS process. In addition, in terms of a good mechanical characteristics of the diaphragm section 64B, as the constituent materials of the metal film 67, it is possible to use a superelastic alloy such as a Ni—Ti alloy, a Cu—Zn alloy, a Ni—Al alloy, a Cu—Cd alloy, a Au—Cd alloy, a Au—Cd—Ag alloy, or a Ti—Al—V alloy, a shape memory alloy, or a relatively high elastic material.

It is possible to achieve the low profile and to lower the cost also by applying the physical quantity sensor 1B as described above.

2. Pressure Sensor

Figure 9:
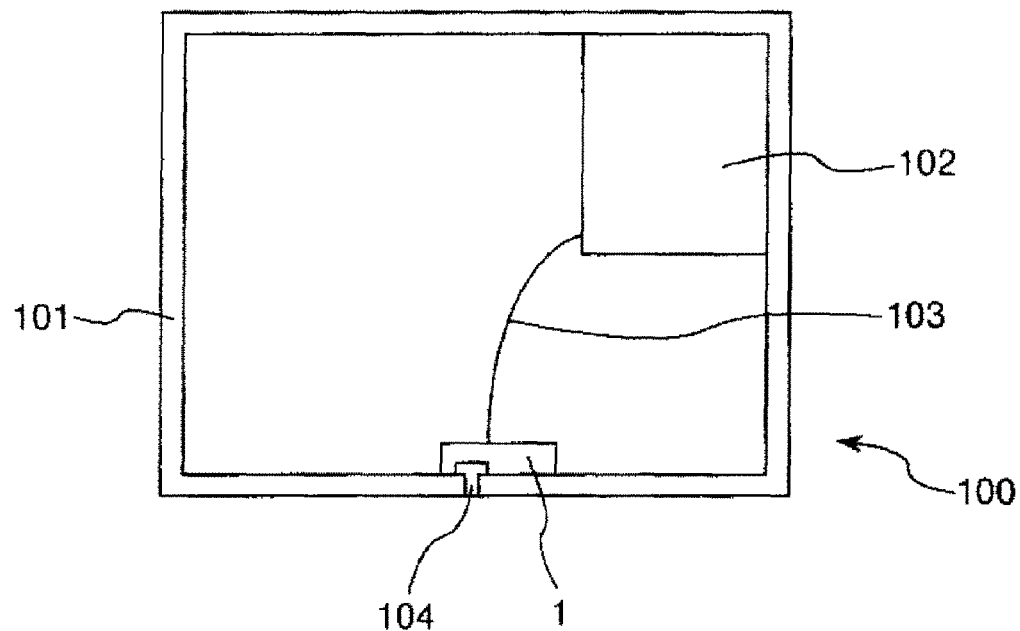
FIG. 9 is a cross-sectional view illustrating an example of a pressure sensor according to the invention.

Next, a pressure sensor (pressure sensor according to the invention) which includes the physical quantity sensor according to the invention will be described. FIG. 9 is a cross-sectional view illustrating an example of the pressure sensor according to the invention.

As illustrated in FIG. 9, a pressure sensor 100 according to the invention includes the physical quantity sensor 1, a housing 101 that accommodates the physical quantity sensor 1, and a computation unit 102 that computes a signal obtained from the physical quantity sensor 1 into pressure data. The physical quantity sensor 1 is electrically connected to the computation unit 102 through a wire 103.

The physical quantity sensor 1 is fixed on the inner side of the housing 101 by using fixing means not illustrated. In addition, in the housing 101, the diaphragm section 64 of the physical quantity sensor 1 has a through-hole 104 for communicating with the atmosphere (outer side of the housing 101).

In such a pressure sensor 100, the diaphragm section 64 receives pressure through the through-hole 104. The signal of the received pressure is transmitted to the computation unit through the wire 103 and is computed into the pressure data. The computed pressure data can be displayed through a display unit not illustrated (for example, a monitor of a personal computer).

3. Altimeter

Figure 10:
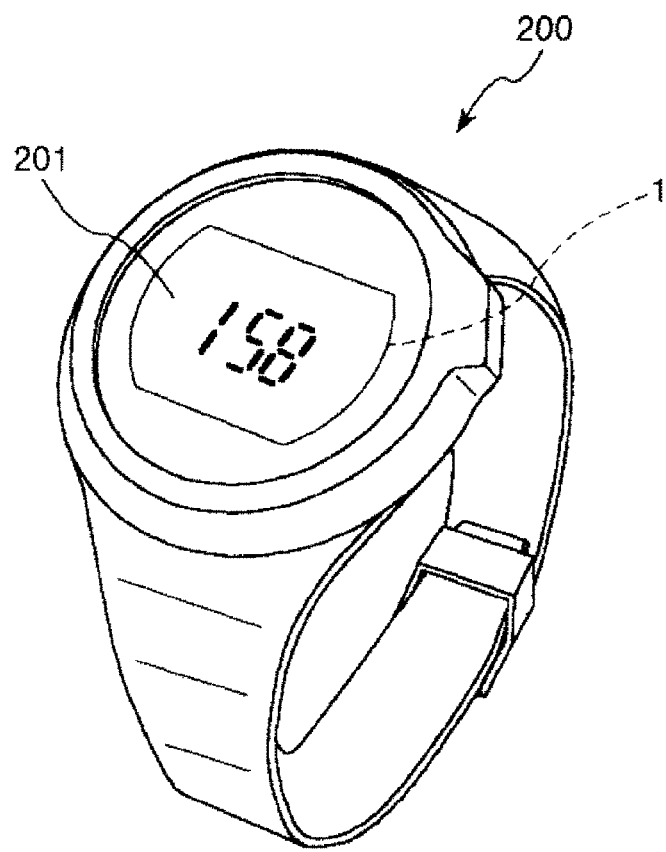
FIG. 10 is a perspective view illustrating an example of an altimeter according to the invention.

Next, an example of an altimeter (altimeter according to the invention) that includes the physical quantity sensor according to the invention will be described. FIG. 10 is a perspective view illustrating an example of the altimeter according to the invention.

An altimeter 200 can be worn on a wrist like a watch. In addition, the physical quantity sensor 1 (pressure sensor 100) is mounted inside the altimeter 200, and thus it is possible to display an altitude at a current location above sea level, atmospheric pressure at the current location, or the like on a display unit 201.

Various items of information such as current time, a user's heart rate, or climate conditions can be displayed on the display unit 201.

4. Electronic Apparatus

Figure 11:
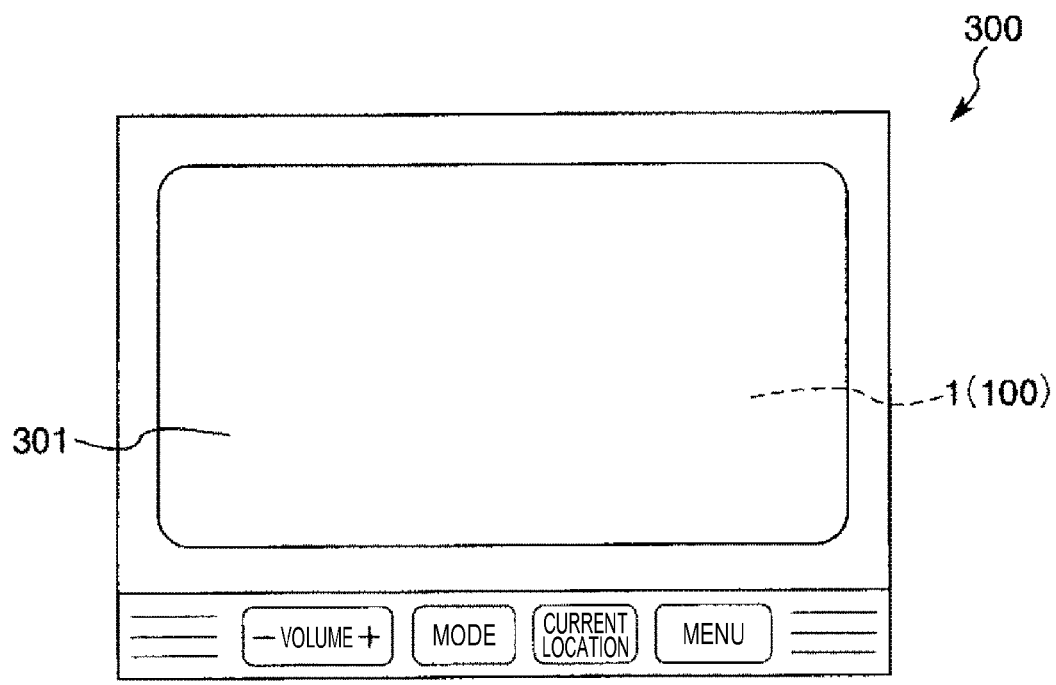
FIG. 11 is a front view illustrating an example of an electronic apparatus according to the invention.

Next, a navigation system will be described, to which an electronic apparatus including the physical quantity sensor according to the invention is applied. FIG. 11 is a front view illustrating an example of the electronic apparatus according to the invention.

A navigation system 300 includes a position information acquiring unit using map information not illustrated and a Global Positioning System (GPS), a self-contained navigation unit using a gyro sensor and an acceleration sensor and vehicle speed data, the physical quantity sensor 1, and a display unit 301 that displays predetermined position information or course information.

In the navigation system, it is possible to acquire altitude information in addition to the acquired position information. Acquisition of the altitude information makes it possible to distinguish an elevated road from a general road. For example, in the case of travelling on the elevated road displayed substantially at the same position as the general road on the position information without the altitude information, it is not possible to be determined in the navigation system whether travelling occurs on the general road or on the elevated road and information on the general road is provided to a user as priority information. However, in the navigation system 300 according to the embodiment, the altitude information can be acquired by the physical quantity sensor 1, an altitude change is detected by approaching the elevated road from the general road, and it is possible to provide the navigation information on a state of travelling on the elevated road to the user.

The display unit 301 is configured to be capable of being miniaturized and thinned by using a liquid crystal panel display, organic electro-luminescence (EL) display, or the like.

The electronic apparatus including the physical quantity sensor according to the invention is not limited thereto, but can be applied to, for example, a personal computer, a mobile phone, a medical apparatus (for example, an electronic thermometer, a sphygmomanometer, a blood glucose meter, an electrocardiogram measuring device, an ultrasonic diagnostic apparatus, or an electronic endoscope), various measurement apparatuses, meters (for example, meters in a vehicle, an aircraft, or a ship), or a flight simulator.

5. Moving Object

Figure 12:
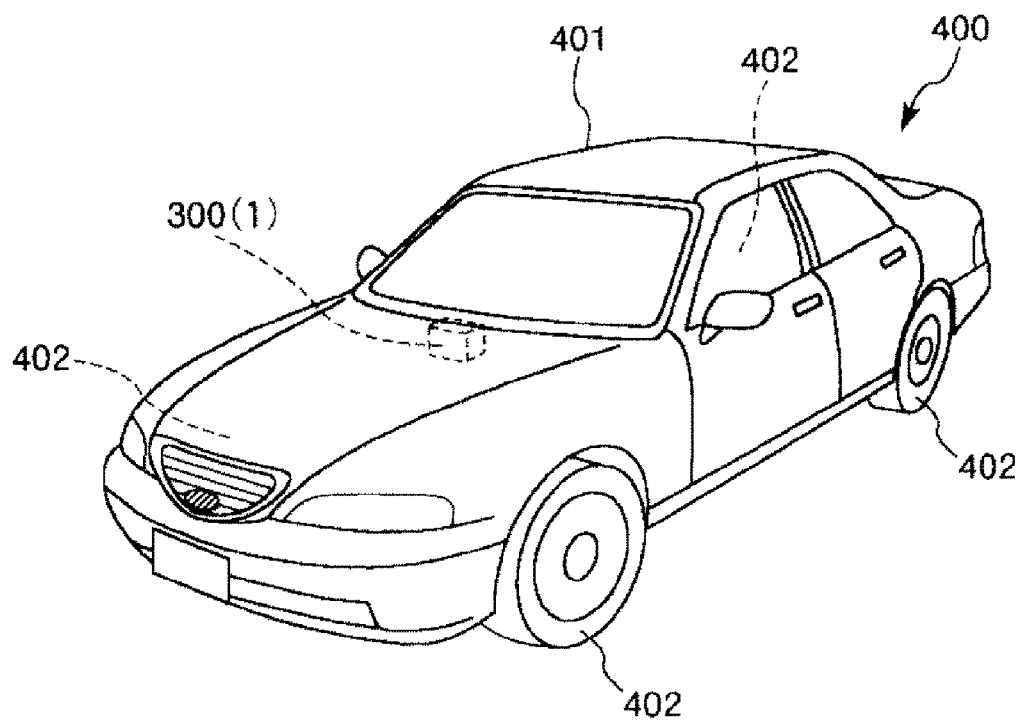
FIG. 12 is a perspective view illustrating an example of a moving object according to the invention.

Next, a moving object (moving object according to the invention) to which the physical quantity sensor according to the invention is applied will be described. FIG. 12 is a perspective view illustrating an example of the moving object according to the invention.

As illustrated in FIG. 12, a moving object 400 includes a vehicle body 401 and four wheels 402, and is configured such that a drive source (engine) (not illustrated) provided in the vehicle body 401 causes the wheels 402 to rotate. The navigation system 300 (physical quantity sensor 1) is built into such a moving object 400.

As above, the physical quantity sensor, the pressure sensor, the altimeter, the electronic apparatus, and the moving object according to the invention are described in accordance with each embodiment illustrated in the drawings, but the invention is not limited thereto, and a configuration of each component can be substituted with an arbitrary configuration that has a similar function. In addition, other arbitrary constituent objects or processes may be added thereto.

In addition, in the above-described embodiments, a case of using the piezoresistive element as the sensor element is described as an example, but the invention is not limited thereto. For example, it is possible to use the vibration element such as a flap type vibrator, and other MEMS vibrators such as a comb electrode, or a quartz crystal vibrator.

In addition, in the above-described embodiment, the case of using four sensor elements is described as an example, but the invention is not limited thereto. The number of the sensor elements may be one to three, or five or more.

In addition, in the above-described embodiment, a case of disposing the sensor element on the surface opposite to the pressure receiving surface of the diaphragm section is described as an example, but the invention is not limited thereto. The sensor element may be disposed on the pressure receiving surface of the diaphragm section, or on both surfaces of the diaphragm section.

In addition, in the above-described embodiment, a case of disposing the sensor element on the outer circumference side of the diaphragm section is described as an example, but the invention is not limited thereto. The sensor element may be disposed at the center portion of the diaphragm section.

What is claimed is:
1. A physical quantity sensor comprising:
a semiconductor substrate;
a diaphragm section that is disposed above the semiconductor substrate and does not include the semiconductor substrate and is flexurally deformed when receiving pressure;
a plurality of sensor elements that are formed on a top surface of the diaphragm section;
a wall section that is disposed above one surface side of the semiconductor substrate and configures a cavity together with the diaphragm section; and
a circuit section that is provided above the same surface side as the wall section of the semiconductor substrate, wherein the wall section includes an inter-layer insulation film formed on a wiring layer of the circuit section, and wherein the inter-layer insulation film has an annular shape to surround the plurality of sensor elements in a plan view.

2. The physical quantity sensor according to claim 1, wherein the sensor element has a piezoresistive element.

3. The physical quantity sensor according to claim 1, wherein the sensor element is disposed above the same surface side as the wall section of the diaphragm section.

4. The physical quantity sensor according to claim 1, wherein the circuit section has an insulation layer that is disposed above the semiconductor substrate and a wiring section that penetrates through the insulation layer, and
wherein the wall section is formed through the same film formation as at least one of the insulation layer and the wiring section.

5. The physical quantity sensor according to claim 4, wherein the diaphragm section includes a layer that is configured of a material which has a lower etching rate with respect to an acid etchant than the insulation layer.

6. The physical quantity sensor according to claim 1, wherein the diaphragm section includes a layer that is configured of a material which has a lower etching rate with respect to an alkali etchant than the semiconductor substrate.

7. The physical quantity sensor according to claim 1, wherein the diaphragm section includes at least one film of a silicon oxide film, a silicon nitride film, and a metal film.

8. The physical quantity sensor according to claim 1, wherein the inside of the cavity is depressurized to be below atmospheric pressure.

9. A pressure sensor comprising:
the physical quantity sensor according to claim 1.

10. An altimeter comprising:
the physical quantity sensor according to claim 1.

11. An electronic apparatus comprising:
the physical quantity sensor according to claim 1.

12. A moving object comprising:
the physical quantity sensor according to claim 1.

* * * * *